US007101653B2

(12) United States Patent
Kaczun et al.

(10) Patent No.: US 7,101,653 B2
(45) Date of Patent: Sep. 5, 2006

(54) LASER-ENGRAVABLE FLEXOGRAPHIC PRINTING ELEMENTS HAVING RELIEF-FORMING ELASTOMERIC LAYERS COMPRISING SYNDIOTACTIC 1,2-POLYBUTADIENE

(75) Inventors: Jürgen Kaczun, Wachenheim (DE); Jens Schadebrodt, Mainz (DE); Margit Hiller, Karlstadt (DE)

(73) Assignee: XSYS Print Solutions Deutschland GmbH, Stuttgart (DE)

( * ) Notice: Subject to any disclaimer, the term of this patent is extended or adjusted under 35 U.S.C. 154(b) by 130 days.

(21) Appl. No.: 10/475,216

(22) PCT Filed: Apr. 15, 2002

(86) PCT No.: PCT/EP02/04162

§ 371 (c)(1),
(2), (4) Date: Oct. 20, 2003

(87) PCT Pub. No.: WO02/083418

PCT Pub. Date: Oct. 24, 2002

(65) Prior Publication Data

US 2004/0115562 A1 Jun. 17, 2004

(30) Foreign Application Priority Data

Apr. 18, 2001 (DE) ............................... 101 18 987

(51) Int. Cl.
*G03C 1/73* (2006.01)
*G03F 7/032* (2006.01)
*G03F 7/028* (2006.01)
*G03F 7/36* (2006.01)

(52) U.S. Cl. .............................. 430/270.1; 430/271.1; 430/306; 430/905; 430/907; 430/944; 430/945; 430/307; 430/300; 430/286.1; 430/287.1; 430/288.1; 430/281.1; 430/285.1; 430/348; 430/349; 430/494; 430/964

(58) Field of Classification Search ............. 430/270.1, 430/271.1, 306, 286.1, 288.1, 287.1, 281.1, 430/285.1, 944, 945
See application file for complete search history.

(56) References Cited

U.S. PATENT DOCUMENTS 4,324,866 A * 4/1982 Furuichi et al. ............ 521/140
4,517,278 A 5/1985 Sakurai ................... 430/286.1
6,313,211 B1 * 11/2001 Scholl et al. ............... 524/492

FOREIGN PATENT DOCUMENTS

| | | |
|---|---|---|
| EP | 76 588 | 4/1983 |
| EP | 405 464 | 1/1991 |
| GB | 1 552 653 | 9/1979 |
| WO | 93/23252 | 11/1993 |

* cited by examiner

*Primary Examiner*—Sin Lee
(74) *Attorney, Agent, or Firm*—Novak Druce Deluca & Quigg

(57) ABSTRACT

A laser-engravable flexographic printing element comprising an elastomeric, relief-forming, laser-engravable, thermally and/or photochemically crosslinkable layer comprising, as binder, at least 5% by weight of syndiotactic 1,2-polybutadiene having a content of 1,2-linked butadiene units of from 80 to 100%, a degree of crystallinity of from 5 to 30% and a mean molecular weight of from 20,000 to 300,000 g/mol on a flexible, dimensionally stable support.

The elastomeric, relief-forming, laser-engravable layer preferably comprises:
(a) from 50 to 99.9% by weight of one or more binders as component A consisting of
(a1) from 5 to 100% by weight of syndiotactic 1,2-polybutadiene having a content of 1,2-linked butadiene units of from 80 to 100%, a degree of crystallinity of from 5 to 30% and a mean molecular weight of from 20,000 to 300,000 g/mol as component A1, and
(a2) from 0 to 95% by weight of further binders as component A2,
(b) from 0.1 to 30% by weight of crosslinking, oligomeric plasticizers which contain reactive groups in the main chain and/or reactive pendant and/or terminal groups as component B,
(c) from 0 to 25% by weight of ethylenically unsaturated monomers as component C,
(d) from 0 to 10% by weight of photoinitiators and/or thermally decomposable initiators as component D,
(e) from 0 to 20% by weight of absorbers for laser radiation as component E, and
(f) from 0 to 30% by weight of further conventional additives as component F.

3 Claims, 8 Drawing Sheets

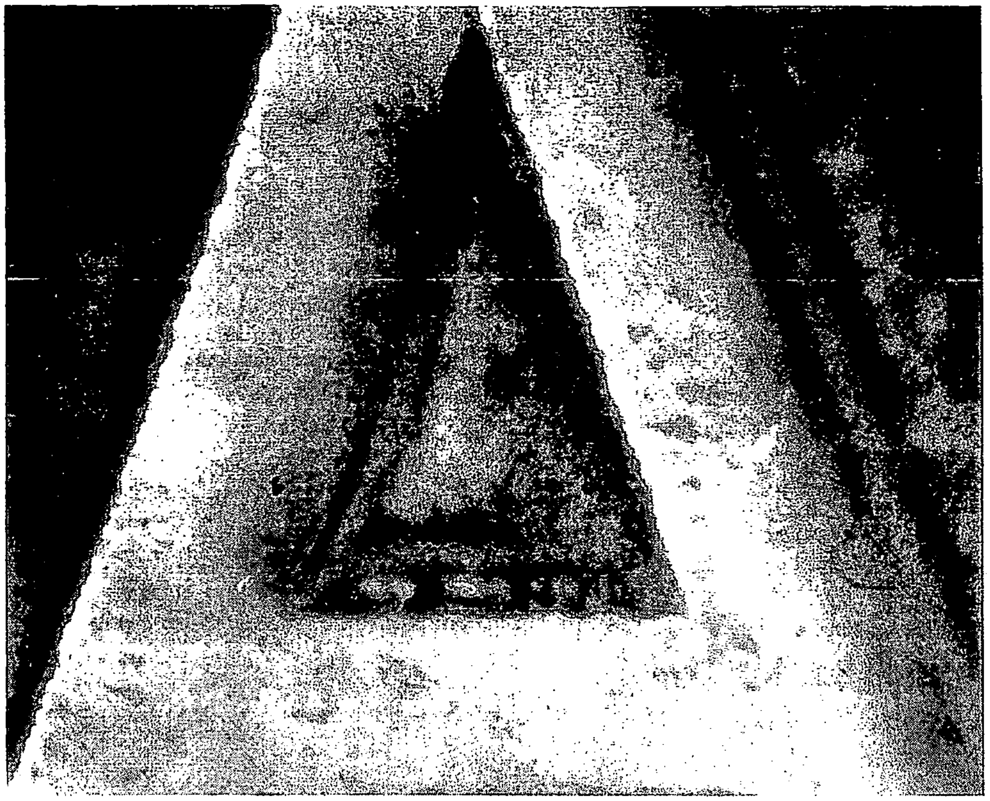
Fig. 1.1
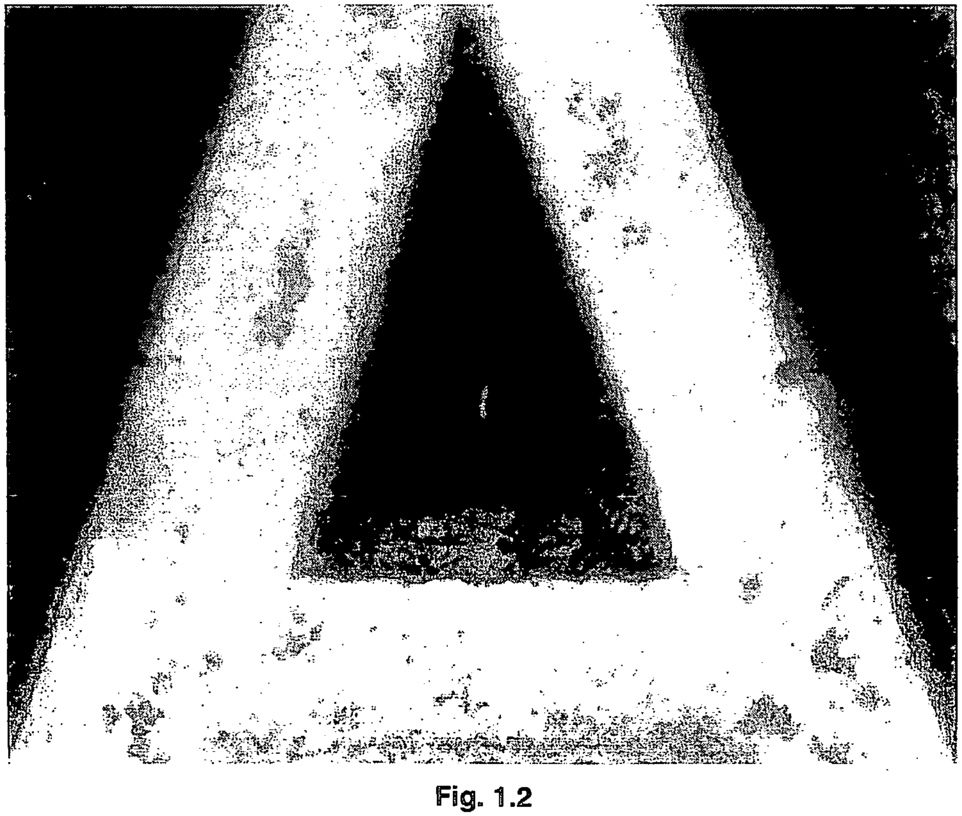
Fig. 1.2

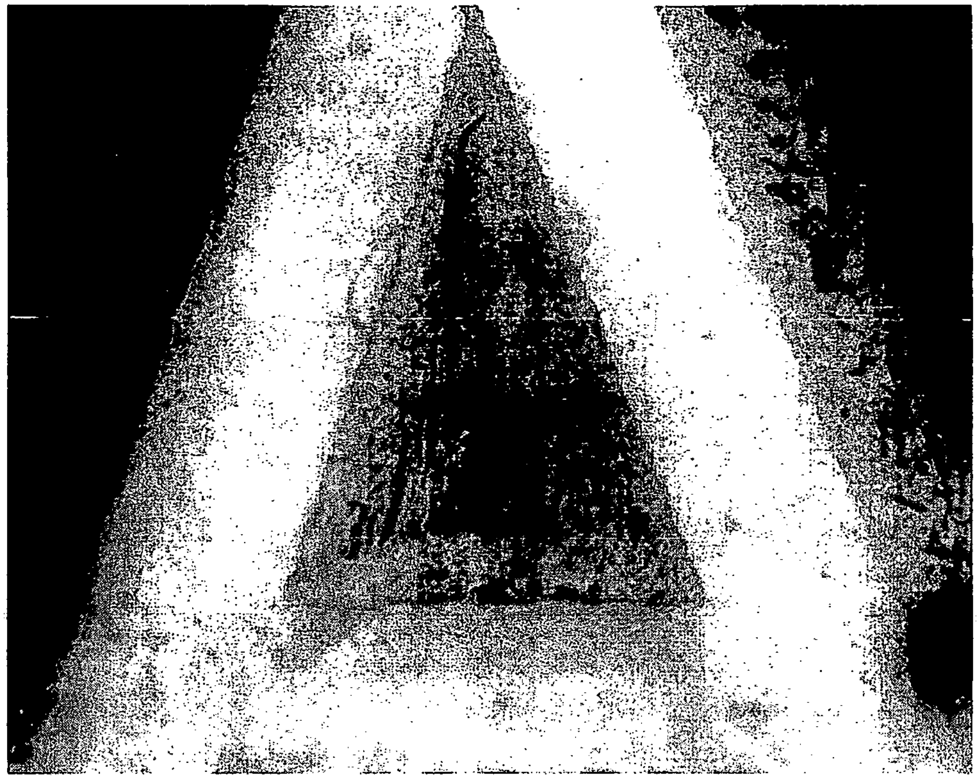
Fig. 1.3
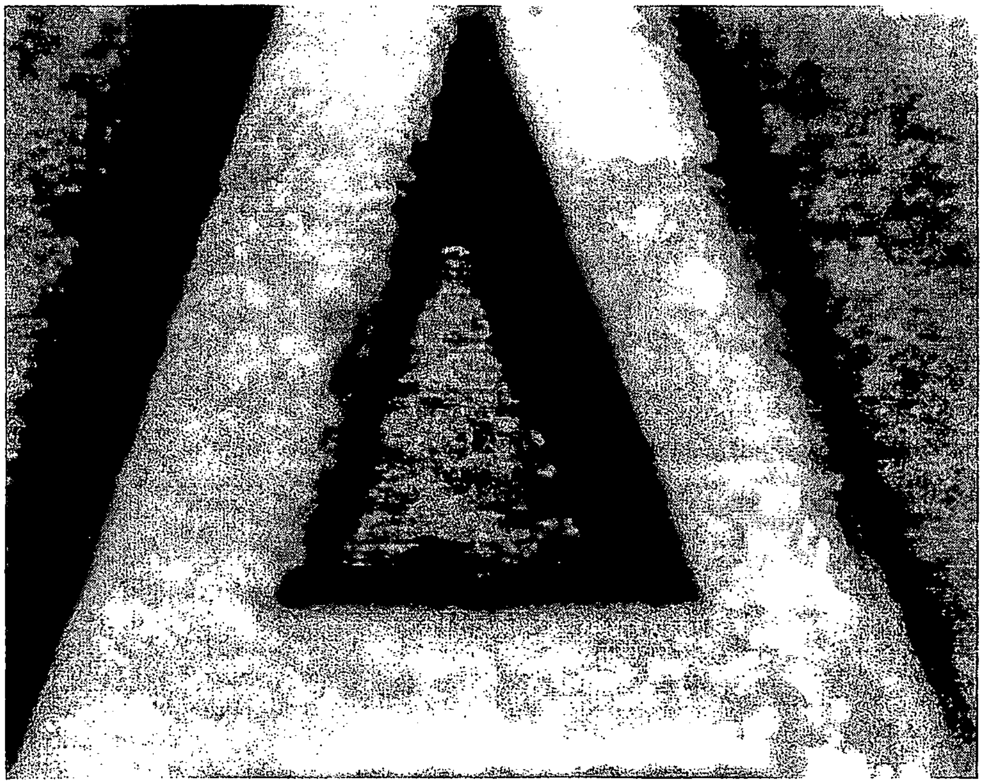
Fig. 1.4

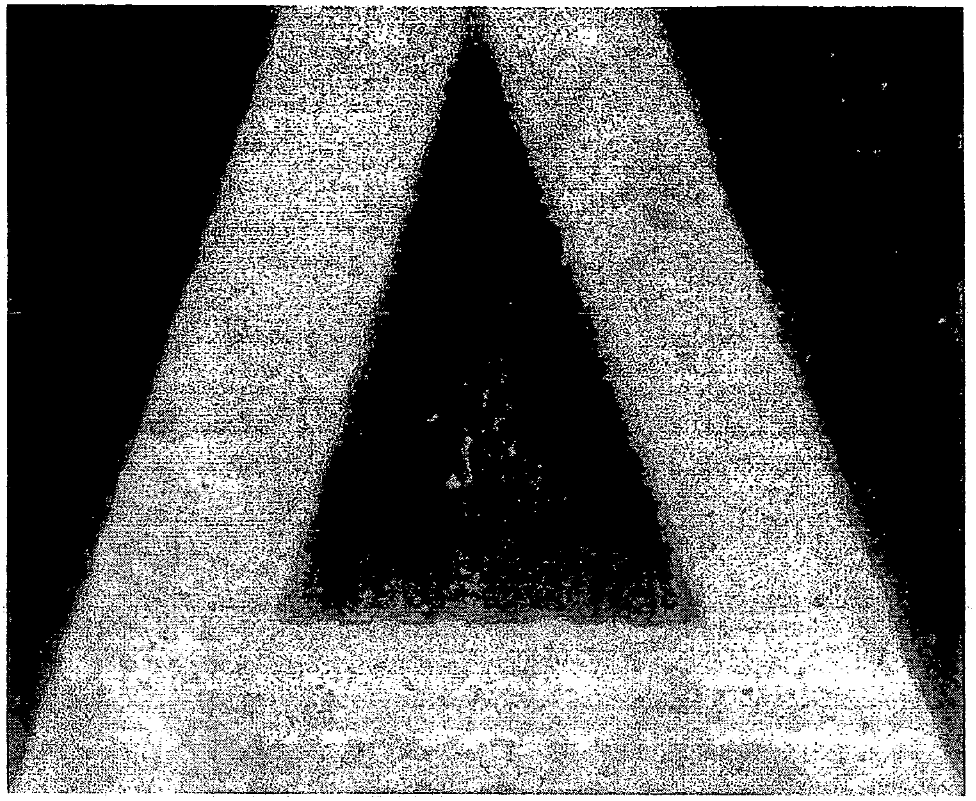
Fig. 1.5
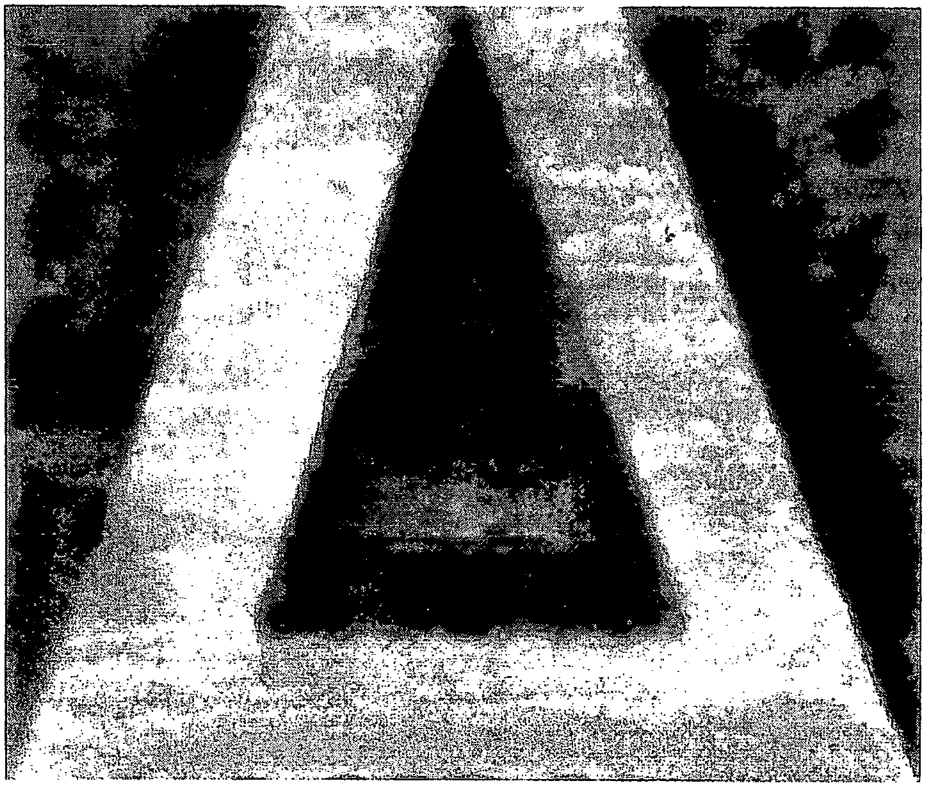
Fig. 1.6

Fig. 1.7
Fig. 1.8

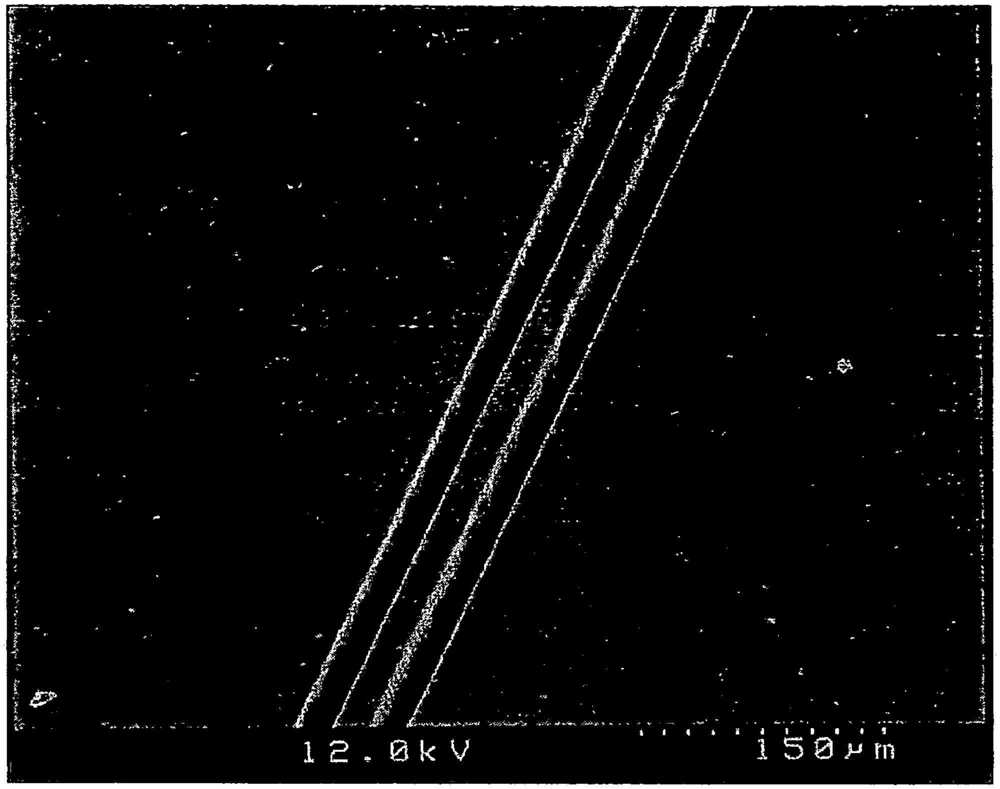
Fig. 2.1
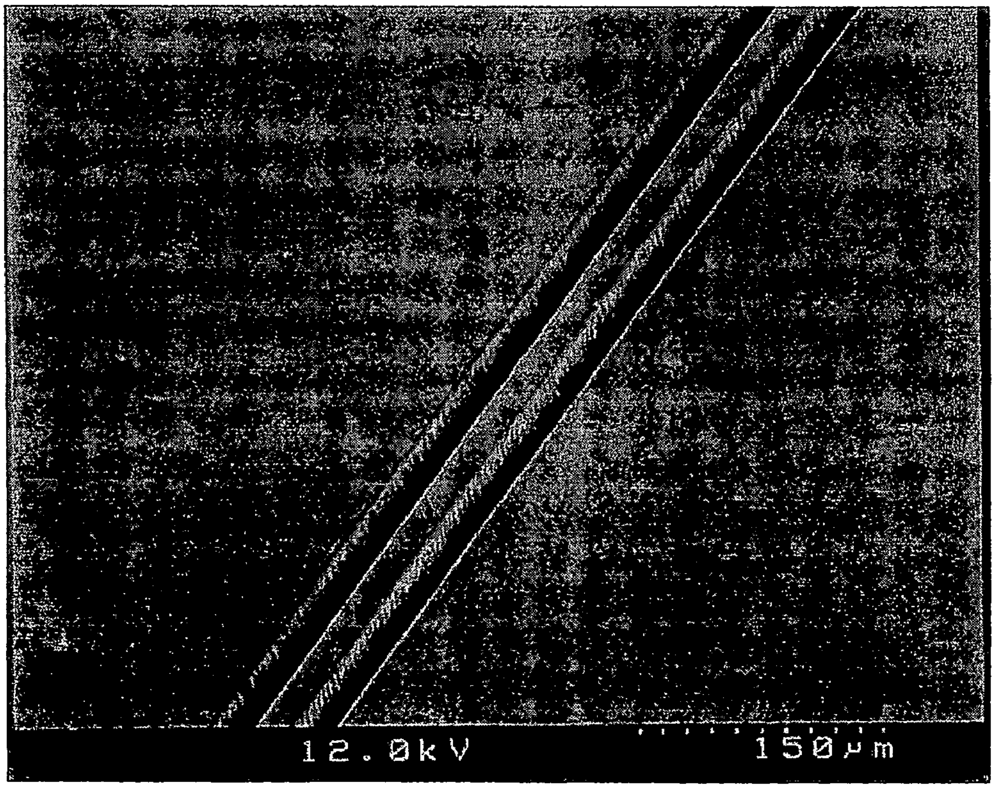
Fig. 2.2

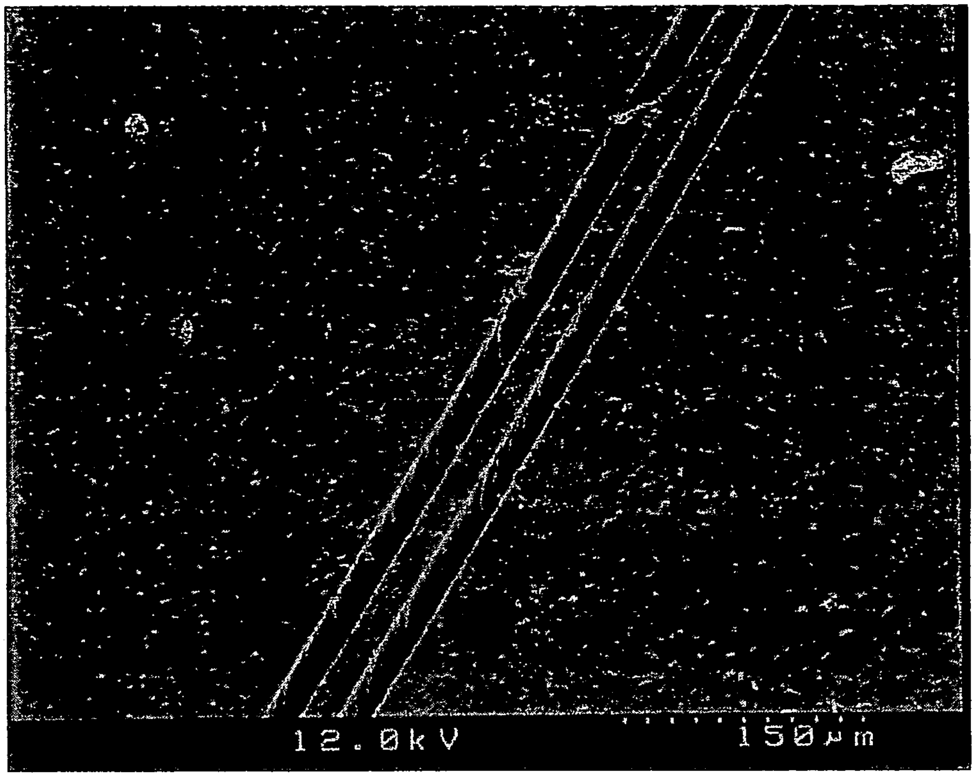
Fig. 2.3
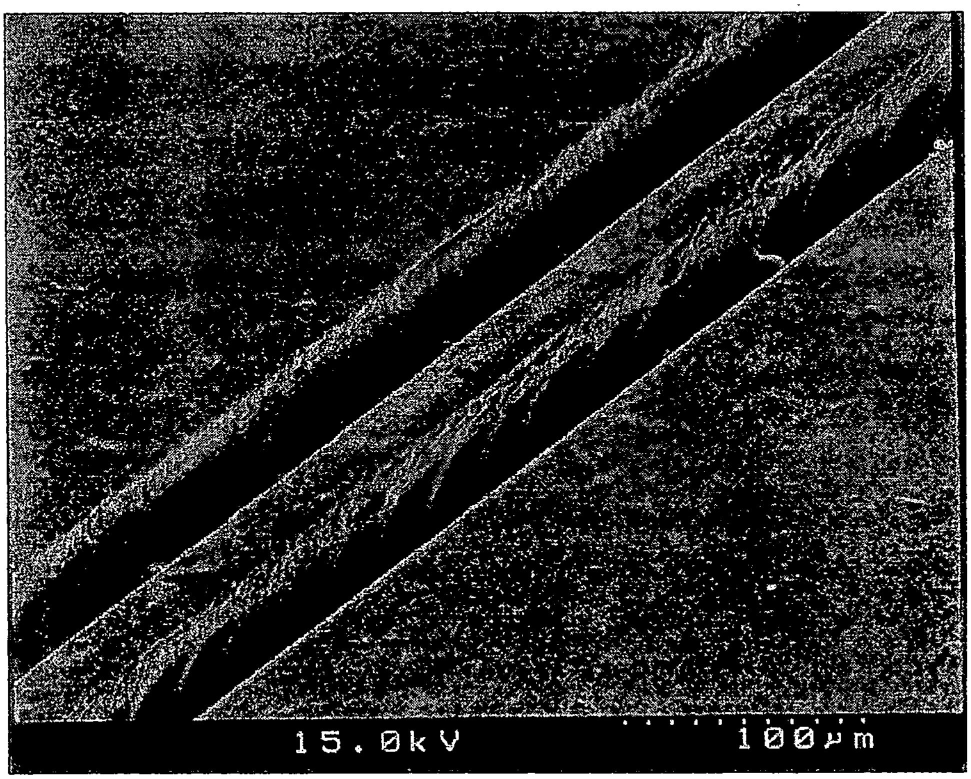
Fig. 2.4

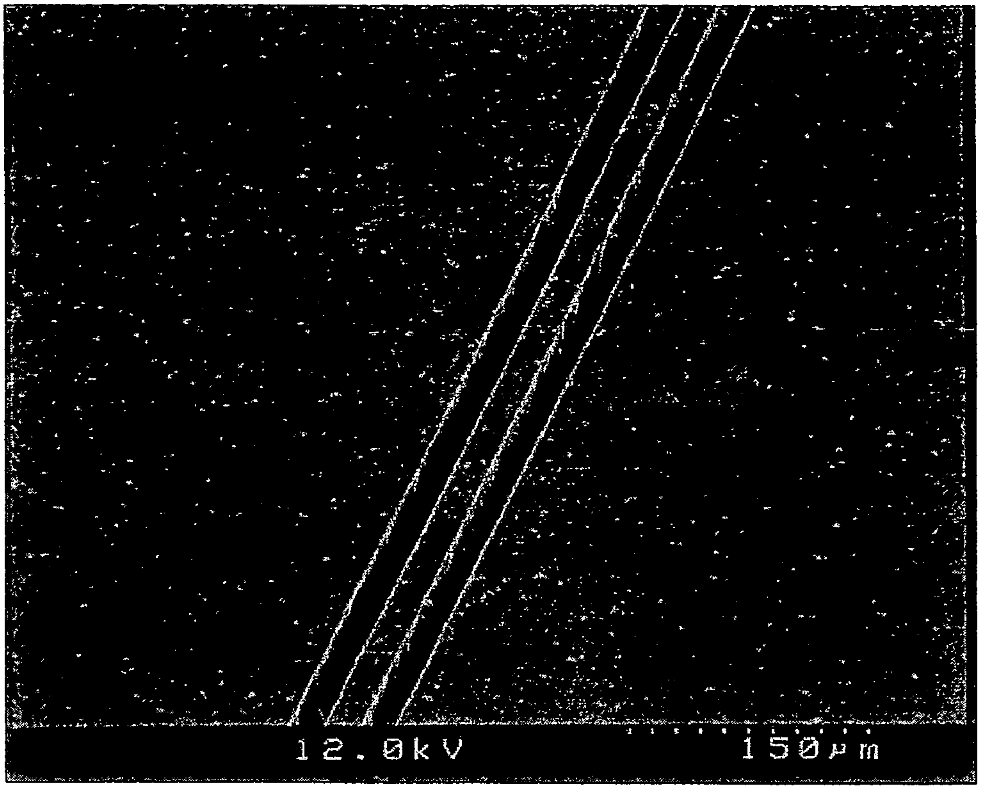
Fig. 2.5
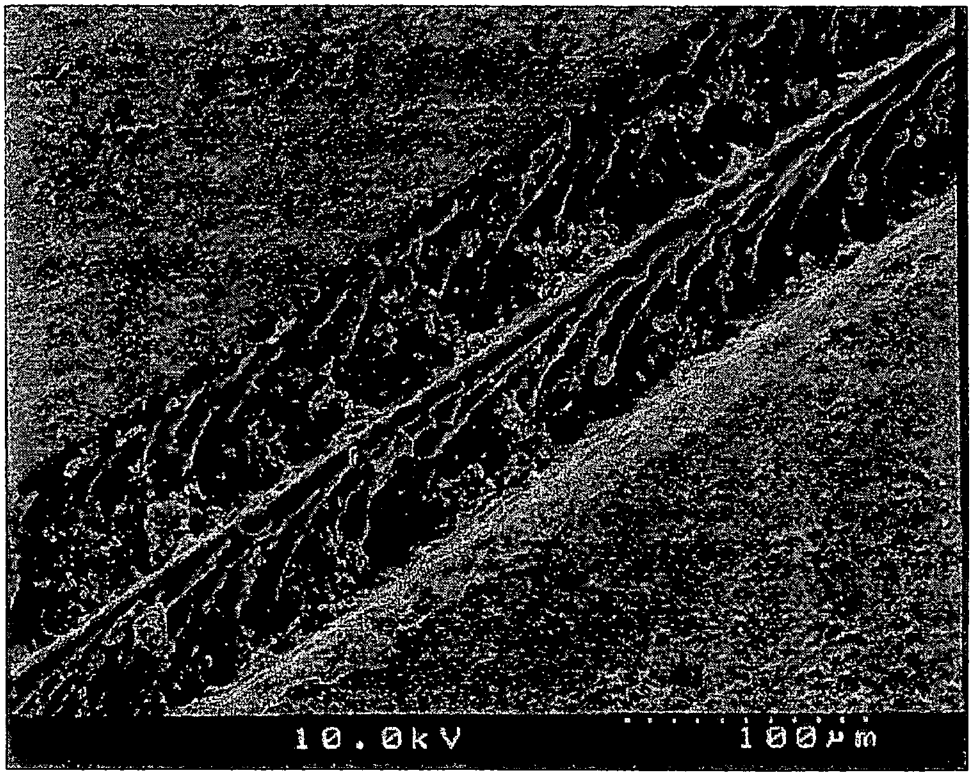
Fig. 2.6

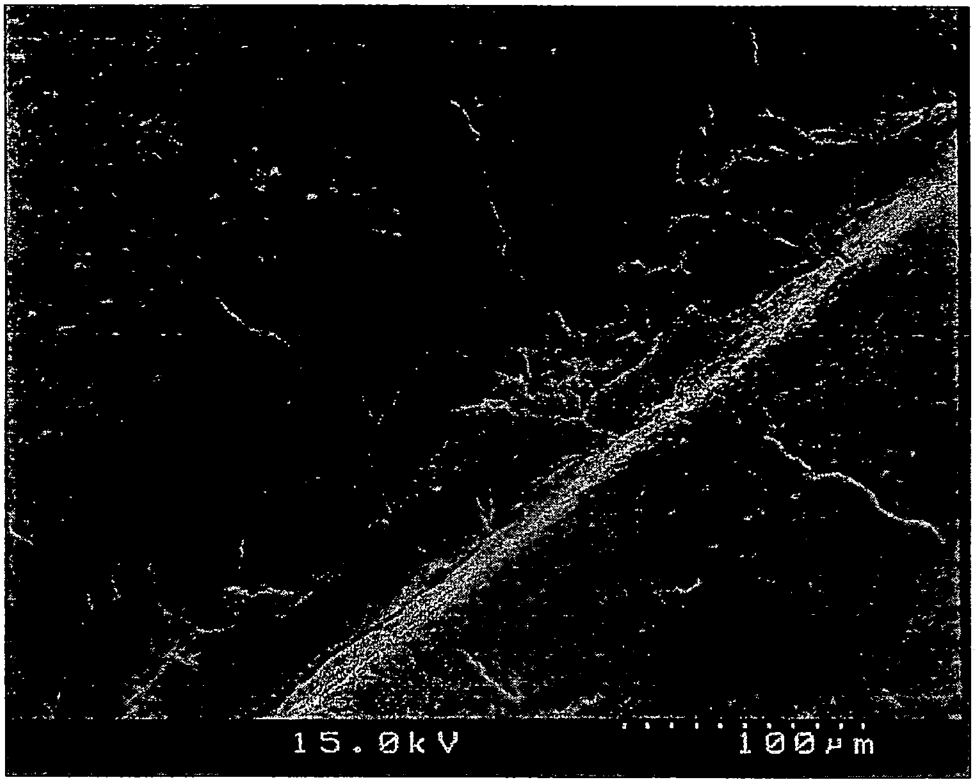
Fig. 2.7
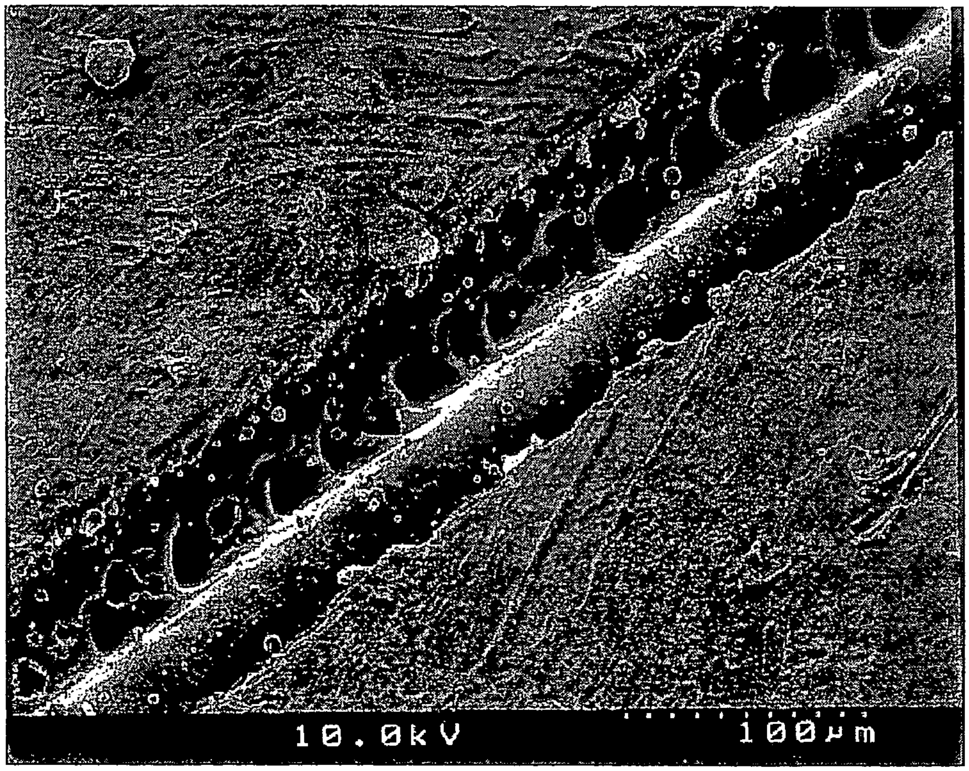
Fig. 2.8

LASER-ENGRAVABLE FLEXOGRAPHIC PRINTING ELEMENTS HAVING RELIEF-FORMING ELASTOMERIC LAYERS COMPRISING SYNDIOTACTIC 1,2-POLYBUTADIENE

The invention relates to laser-engravable flexographic printing elements having relief-forming elastomeric layers comprising syndiotactic 1,2-polybutadiene, to a process for the production of relief printing elements from the laser-engravable flexographic printing elements, and to the use of syndiotactic 1,2-polybutadiene as binder in the elastomeric relief-forming layers.

The conventional method for the production of flexographic printing plates by laying a photographic mask onto a photopolymeric recording element, irradiating the element with actinic light through this mask, and washing out the unpolymerized areas of the exposed element using a developer liquid is increasingly being replaced by methods in which lasers are used.

In laser direct engraving, recesses are engraved directly into an elastomeric layer which is suitable for this purpose with the aid of a laser of sufficient power, in particular by means of an IR laser, forming a relief which is suitable for printing. To this end, large amounts of the material of which the printing relief consists have to be removed. A typical flexographic printing plate has a thickness of, for example, between 0.5 and 7 mm, and the non-printing recesses in the plate have a depth of between 0.3 and 3 mm. The method of laser direct engraving for the production of flexographic printing plates has therefore only achieved commercial interest in recent years with the appearance of improved laser systems, although laser engraving of rubber printing cylinders using $CO_2$ lasers has in principle been known since the late 1960s. The demand for suitable laser-engravable flexographic printing elements as starting material for the production of relief printing elements by means of laser engraving has thus also become significantly greater.

WO 93/23252 discloses laser-engravable, flexographic printing elements comprising a laser-engravable, elastomeric layer comprising at least one thermoplastic elastomer as binder on a support, and processes for the production of flexographic printing plates. In this process, the laser-engravable elastomeric layer is strengthened thermochemically by warming or photochemically by irradiation with actinic light, and the printing relief is subsequently engraved by means of a laser. As binder, the specification mentions copolymers of butadiene and styrene, copolymers of isoprene and styrene, styrene-dienestyrene 3-block copolymers, such as polystyrene-polybutadiene-polystyrene (SBS), polystyrene-polyisoprene-polystyrene (SIS) or polystyrene-poly(ethylenebutylene)-polystyrene (SEBS). Furthermore, generally uncrosslinked polybutadienes and polyisoprenes are also mentioned.

EP-A 0 076 588 discloses photocrosslinkable flexographic printing elements comprising a mixture of from 30 to 70% of syndiotactic 1,2-polybutadiene having a degree of crystallinity of from 5 to 20%, a content of 1,2-linked units of 85% and a molecular weight of greater than 100,000 g/mol, and from 70 to 30% of cis-1,4-polyisoprene. The printing elements are exposed imagewise to UV light and developed by washing out the uncrosslinked areas using an organic solvent.

U.S. Pat. No. 4,517,278 discloses a flexographic printing plate which is melt-pressed from a photosensitive molding composition comprising syndiotactic 1,2-polybutadiene (I) which has been swollen with a solution of an ethylenically unsaturated monomer (II), and a photoinitiator (III). (I) has a mean molecular weight of from 10,000 to 300,000 g/mol, a content of 1,2-linked polybutadiene units of at least 80% and a degree of crystallinity of from 10 to 30%. (II) is an ester of methacrylic acid with a $C_4$–$C_{20}$-alkanol, and (III) is benzoin or a benzoin alkyl ether. For the production, pellets of (I) are swollen in a solution of (II) and subsequently melt-pressed to give plates having a thickness of from 0.1 to 10 mm. This process can only be carried out discontinuously and is complex. The printing plates produced in the examples require xylene as wash-out agent for development. Shore A hardnesses of from 60 to 65 are only achieved with the concomitant use of relatively large amounts of non-crosslinking plasticizers, such as vinyl ethers or phthalates. These form melt edges during laser engraving.

The known binders have the disadvantage of in some cases long exposure durations during photochemical crosslinking of the elastomeric relief-forming layers and not always satisfactory resolution and sharpness of the engraved printing reliefs.

It is the object of the present invention to provide an improved laser-engravable flexographic printing element. We have found that the object of the invention is achieved by a laser-engravable flexographic printing element comprising an elastomeric, relief-forming, laser-engravable, thermally or photochemically cross-linkable layer comprising, as binder, at least 5% by weight of syndiotactic 1,2-polybutadiene having a content of 1,2-linked butadiene units of from 80 to 100%, a degree of crystallinity of from 5 to 30% and a mean molecular weight of from 20,000 to 300,000 g/mol on a flexible support.

For the purposes of the present invention, the term "laser-engravable" is taken to mean that the elastomeric, relief-forming layer has the property of absorbing laser radiation, in particular the radiation of an IR laser, in such a way that it is removed or at least loosened at the points at which it is exposed to a laser beam of sufficient intensity. The layer is preferably evaporated or thermally or oxidatively decomposed in the process without previously melting, and its decomposition products are removed from the layer in the form of hot gases, vapors, fumes or small particles.

The elastomeric, relief-forming layers produced using the specific syndiotactic 1,2-polybutadiene as binder give very sharp and high-resolution relief elements on laser engraving. During laser engraving, melt edges do not form, but instead merely slight deposits, which can be removed mechanically or by simple post-treatment with water or alcohol. Furthermore, the elastomeric, relief-forming layers can be photocrosslinked extremely quickly by irradiation with UV-A light.

The above advantages are achieved even without the concomitant use of additives, such as plasticizers, ethylenically unsaturated, crosslinking monomers or initiators, in the relief-forming elastomeric layers.

However, the relief-forming, elastomeric, laser-engravable layer preferably comprises (a) from 50 to 99.9% by weight, preferably from 60 to 85% by weight, of one or more binders as component A consisting of
  - (a1) from 5 to 100% by weight, preferably from 50 to 85% by weight, of syndiotactic 1,2-polybutadiene having a content of 1,2-linked butadiene units of from 80 to 100%, a degree of crystallinity of from 5 to 30% and a mean molecular weight of from 20,000 to 300,000 g/mol as component A1, and
  - (a2) from 0 to 95% by weight, preferably from 0 to 50% by weight, of further binders as component A2, where the sum of components A1 and A2 adds up to 100% by weight, (b) from 0.1 to 30% by weight, preferably from 5 to 20% by weight, of crosslinking, oligomeric plasticizers which contain reactive groups in the main chain and/or reactive pendant and/or terminal groups as component B, (c) from 0 to 25% by weight, preferably from 5 to 20% by weight, of ethylenically unsaturated monomers as component C, (d) from 0 to 10% by weight, preferably from 0.1 to 5% by weight, of photoinitiators and/or thermally decomposable initiators as component D, (e) from 0 to 20% by weight, preferably from 0 to 10% by weight, of absorbers for laser radiation as component E, and (f) from 0 to 30% by weight, preferably from 0 to 10% by weight, of further conventional additives as component F, where the sum of components A to F adds up to 100% by weight.

The elastomeric, relief-forming layer comprises, as component A1, syndiotactic 1,2-polybutadiene having a content of 1,2-linked butadiene units of from 80 to 100%, a degree of crystallinity of from 5 to 30% and a mean molecular weight of from 20,000 to 300,000 g/mol. The content of 1,2-linked butadiene units is preferably from 90 to 95%, particularly preferably from 90 to 92%, the degree of crystallinity is preferably from 10 to 30%, particularly preferably from 15 to 30%, and the mean molecular weight is preferably from 80,000 to 200,000 g/mol, particularly preferably from 100,000 to 150,000 g/mol.

If desired, the elastomeric, relief-forming layer comprises further binders as component A2. In principle, both elastomeric binders and thermoplastic-elastomeric binders are suitable. Examples of suitable binders are the known three-block copolymers of the SIS or SBS type, which may also be fully or partially hydrogenated. It is also possible to employ elastomeric polymers of the ethylene-propylene-diene type, ethylene-acrylic acid rubbers or elastomeric polymers based on acrylates or acrylate copolymers. Further examples of suitable polymers are disclosed in DE-A 22 15 090, EP-A 0 84851, EP-A 819 984 or EP-A 553 662. It is also possible to employ two or more different further binders.

The elastomeric, relief-forming layer comprises, as component B, crosslinking, oligomeric plasticizers which contain reactive groups in the main chain and/or reactive pendant and/or terminal groups. Examples of suitable plasticizers are polybutadiene oils, polyisoprene oils, allyl citrates and further synthetic plasticizers containing allyl groups having a viscosity of from 500 to 150,000 mPas at 25° C., which may contain functional end groups, such as OH groups. Also suitable are unsaturated fatty acids and derivatives thereof, such as oleic acid, linoleic acid, linolenic acid, undecanoic acid, erucic acid and derivatives thereof, for example esters thereof, and unsaturated terpenes and derivatives thereof.

Preferred crosslinking, oligomeric plasticizers are the said polybutadiene oils and polyisoprene oils. These preferably have a viscosity of from 500 to 100,000 mPas, particularly preferably from 500 to 10,000 mPas, at 25° C. Suitable are, for example, polybutadiene oils from Chemetall, Hüls and Elf Atochem. These have a molecular weight of from about 1000 to about 3000 g/mol, a content of 1,2-linked units of frequently from 40 to 50%, often also only of about 20% or 1%, a flash point of from 170° C. to 300° C. and a viscosity of from 700 to 100,000 mPas at 25° C.

Through the use of the crosslinking, oligomeric plasticizers, melt phenomena during laser engraving are avoided particularly efficiently. Furthermore, particularly good ink transfer to the printing relief layers is achieved, for example using water-based or alcohol-based printing inks or UV-curable printing inks.

The elastomeric, relief-forming layer comprises, if desired, ethylenically unsaturated monomers as component C. The ethylenically unsaturated monomers are advantageous, but not necessary, since the elastomeric, relief-forming layer can also crosslink in their absence. The monomers should be compatible with the binders and have at least one polymerizable, ethylenically unsaturated double bond. Suitable monomers generally have a boiling point of greater than 100° C. at atmospheric pressure and a molecular weight of up to 3000 g/mol, preferably up to 2000 g/mol. Esters and amides of acrylic acid and methacrylic acid with mono- or polyfunctional alcohols, amines, aminoalcohols and hydroxyethers and -esters, styrene and substituted styrenes, esters of fumaric and maleic acid, and allyl compounds having proven particularly advantageous. Examples of suitable monomers are butyl acrylate, 2-ethylhexyl acrylates, lauryl acrylates, isobornyl methacrylate, isodecyl methacrylate, 1,4-butanediol diacrylate, 1,6-hexanediol diacrylate, 1,6-hexanediol dimethacrylate, 1,9-nonanediol diacrylate, trimethylolpropane triacrylate, dioctyl fumarate and N-dodecylmaleimide. It is also possible to employ mixtures of different monomers.

The elastomeric, relief-forming layer comprises, if desired, photoinitiators and/or thermally decomposable initiators as component D. The presence of photoinitiators is not necessary, but is advantageous, since the elastomeric, relief-forming layer can also crosslink photochemically in the absence of photoinitiators. If the elastomeric, relief-forming layer is to be thermally crosslinked, the presence of thermally decomposable initiators in amounts of from 0.1 to 5% by weight, based on the sum of components A to F, is generally necessary. The elastomeric, relief-forming layer may also be photochemically and thermally cross-linked, in which case photoinitiators and/or thermally decomposable initiators may be present as component D.

Suitable photoinitiators are benzoin and benzoin derivatives, such as methylbenzoin and benzoin ethers, benzil derivatives, such as benzil ketals, acylarylphosphine oxides, acylarylphosphinic acid esters and polycyclic quinones, without it being intended for the list to be restricted thereto. Preference is given to photoinitiators which have high absorption between 300 and 450 nm.

Examples of suitable thermally decomposable initiators are peroxyesters, such as t-butyl peroctanoate, t-amyl peroctanoate, t-butyl peroxyisobutyrate, t-butyl peroxymaleate, t-amyl perbenzoate, di-t-butyl diperoxyphthalate, t-butyl perbenzoate, t-butyl peracetate and 2,5-di(benzoylperoxy)-2,5-dimethylhexane, certain diperoxyketals, such as 1,1-di(t-amylperoxy)cyclohexane, 1,1-di(t-butylperoxy)cyclohexane, 2,2-di(t-butylperoxy)butane and ethyl 3,3-di(t-butylperoxy)butyrate, certain dialkyl peroxides, such as di-t-butyl peroxide, t-butyl cumene peroxide, dicumene peroxide and 2,5-di(t-butylperoxy)-2,5-dimethylhexane, certain diacyl peroxides, such as dibenzoyl peroxide and diacetyl peroxide, certain t-alkyl hydroperoxides, such as t-butyl hydroperoxide, t-amyl hydroperoxide, pinane hydroperoxide and cumene peroxide. Also suitable are certain azo compounds, for example 1-(t-butylazo)formamide, 2-(t-butylazo)isobutyronitrile, 1-(t-butyl-azo)cyclohexanecarbonitrile, 2-(t-butylazo)-2-methylbutanitrile, 2,2'-azobis(2-acetoxypropane), 1,1'-azobis(cyclohexanecarbonitrile), 2,2'-azobis(isobutyronitrile) and 2,2'-azobis(2-methylbutanitrile).

The elastomeric, relief-forming layer may comprise absorbers for laser radiation as component E. The presence of the absorbers is advantageous, but not necessary so long as the binders already absorb laser radiation of a suitable wavelength, for example that of a $CO_2$ laser. Suitable absorbers for laser radiation have high absorption in the region of the laser wavelength. Particularly suitable absorbers are those which have high absorption in the near infrared and in the long-wave VIS region of the electromagnetic spectrum. Absorbers of this type are particularly suitable for the absorption of radiation from high-power Nd:YAG lasers (1064 nm) and IR diode lasers, which typically have wavelengths of between 700 and 900 nm and between 1200 and 1600 nm.

Examples of suitable absorbers for laser radiation are dyes which absorb strongly in the infrared spectral region, for example phthalocyanines, naphthalocyanines, cyanines, quinones, metal complex dyes, such as dithiolenes, and photochromic dyes.

Further suitable absorbers are inorganic pigments, in particular intensely colored inorganic pigments, for example chromium oxides, iron oxides, carbon black or metallic particles.

Particularly suitable absorbers for laser radiation are finely divided carbon black grades having a particle size of from 10 to 50 nm.

Further particularly suitable absorbers for laser radiation are iron-containing solids, in particular intensely colored iron oxides. Iron oxides of this type are commercially available and are usually employed as colored pigments or as pigments for magnetic recording.

Suitable absorbers for laser radiation are, for example, FeO, goethite (alpha-FeOOH), akaganeite (beta-FeOOH), lepidocrocite (gamma-FeOOH), hematite (alpha-$Fe_2O_3$), maghemite (gamma-$Fe_2O_3$), magnetite ($Fe_3O_4$) and berthollides. It is furthermore possible to employ doped iron oxides or mixed oxides of iron with other metals. Examples of mixed oxides are umbra $Fe_2O_3 \times n\ MnO_2$ or $Fe_xAl_{(1-x)}OOH$, in particular various spinel black pigments, such as $Cu(Cr,Fe)_2O_4$, $Co(Cr,Fe)_2O_4$ or $Cu(Cr,Fe,Mn)_2O_4$. Examples of dopants are, for example, P, Si, Al, Mg, Zn and Cr. Dopants of this type are generally added in small amounts during the synthesis of the oxides in order to control the particle size and particle shape. The iron oxides may also be coated. Coatings of this type may be applied, for example, in order to improve the dispersibility of the particles. These coatings may consist, for example, of inorganic compounds, such as $SiO_2$ and/or AlOOH. However, it is also possible to apply organic coatings, for example organic adhesion promoters, such as aminopropyl(trimethoxy)silane. Particularly suitable as absorbers for laser radiation are FeOOH, $Fe_2O_3$ and $Fe_3O_4$, very particularly preferably $Fe_3O_4$.

The elastomeric, relief-forming layer may comprise further additives as component F. Further additives are non-crosslinking plasticizers, fillers, dyes, compatibilizers and dispersion aids.

The flexographic printing elements according to the invention have the usual layer structure and consist of a flexible, dimensionally stable support, if desired an elastomeric sub-layer, one or more elastomeric, relief-forming, laser-engravable layers, where the various layers may be bonded by adhesive layers, and a protective film, if desired coated with a release layer.

The flexographic printing elements according to the invention comprise a flexible, dimensionally stable support. Examples of suitable flexible, dimensionally stable supports for laser-engravable flexographic printing elements are plates, foils, films and conical and cylindrical sleeves of metals, such as steel, aluminum, copper or nickel, or of plastics, such as polyethylene terephthalate (PET), polyethylene naphthalate (PEN), polybutylene terephthalate, polyamide, polycarbonate, possibly also woven and nonwoven fabrics, such as glass fiber fabrics, and composite materials, for example made from glass fibers and plastics. Particularly suitable dimensionally stable supports are dimensionally stable support films, for example polyester films, in particular PET and PEN films.

Particularly advantageous are flexible metal supports which are so thin that they can be bent around the printing cylinder. On the other hand, however, they are also dimensionally stable and sufficiently thick that the support is not kinked during production of the laser-engravable element or mounting of the finished printing plate on the printing cylinder.

The elastomeric, relief-forming, laser-engravable layer is located on the support, if desired on an elastomeric sub-layer.

The elastomeric, relief-forming, laser-engravable layer may also have a multilayer structure. These laser-engravable, crosslinkable part layers may be of identical, approximately identical or different material composition. A multilayer structure of this type, in particular a two-layer structure, is sometimes advantageous since it enables surface properties and layer properties to be optimized independently of one another in order to achieve an optimum print result. The laser-engravable flexographic printing element may, for example, have a thin laser-engravable top layer whose composition has been selected with respect to optimum ink transfer, or the composition of the underlying layer has been selected with regard to optimum hardness or elasticity.

The thickness of the elastomeric, relief-forming, laser-engravable layer or of all relief-forming layers together is generally from 0.1 to 7 mm. The thickness is selected by the person skilled in the art depending on the desired use of the printing plate.

The laser-engravable flexographic printing element according to the invention may, if desired, comprise further layers. For example, an elastomeric sub-layer, which need not necessarily be laser-engravable, may be located between the support and the laser-engravable layer(s). A sub-layer of this type enables the mechanical properties of the relief printing plates to be modified without the properties of the actual printing relief layer being affected. So-called elastic sub-structures, which are located on the opposite side of the dimensionally stable support from the laser-engravable layer, serve the same purpose.

Further layers may be adhesive layers which bond the support to overlying layers or bond various layers to one another.

Furthermore, the laser-engravable flexographic printing element may be protected against mechanical damage by a protective film, for example consisting of PET, which is located on the uppermost layer in each case, and which is in each case removed before the laser engraving. In order to simplify peeling off, the protective film may also be siliconized or provided with a suitable release layer.

The laser-engravable flexographic printing element can be produced, for example, by dissolution or dispersion of all components in a suitable solvent, and casting onto a support.

In the case of multilayered elements, a plurality of layers can be cast one on top of the other in a manner known per se. Alternatively, the individual layers can be cast, for example, onto temporary supports, and the layers subsequently bonded to one another by lamination. In particular, photochemically crosslinkable systems can be produced by extrusion and/or calendering. This method can in principle also be employed for thermally crosslinkable systems so long as only components which do not crosslink at the process temperature are employed.

Thermal and/or photochemical crosslinking of the elastomeric, relief-forming layer of the laser-engravable flexographic printing elements according to the invention and engraving of a printing relief gives relief printing elements.

The invention thus also relates to a process for the production of a relief printing element having the steps (i) thermal or photochemical crosslinking of the elastomeric, relief-forming layer of the flexographic printing element according to the invention, and (ii) laser engraving of the printing relief according to the invention into the crosslinked, elastomeric, relief-forming layer.

The elastomeric, relief-forming, laser-engravable layer is photochemically and/or thermally crosslinkable. The photochemical crosslinking is carried out, in particular, by irradiation with short-wave visible or long-wave ultraviolet light. Naturally, however, radiation of higher energy, such as short-wave UV light or X-rays, or—given suitable sensitization—also longer-wave light is in principle also suitable. Electron radiation is particularly suitable for the crosslinking.

Particularly short irradiation times are achieved for the photochemical crosslinking using the laser-engravable flexographic printing elements according to the invention. These can be, in accordance with the invention, from as little as 10 seconds to 5 minutes, compared with from 5 to 30 minutes on use of materials in accordance with the prior art.

The thermal crosslinking is generally carried out by warming the flexographic printing element to temperatures of, in general, from 80 to 220° C., preferably from 120 to 200° C., for a period of from 2 to 30 minutes.

Particularly suitable for laser engraving are $CO_2$ lasers having a wavelength of 10640 nm, but also Nd:YAG lasers (1064 nm) and IR diode lasers or solid-state lasers, which typically have wavelengths of between 700 and 900 nm and between 1200 and 1600 nm. However, it is also possible to employ lasers of shorter wavelength, provided that the lasers have adequate intensity. For example, it is also possible to employ a frequency-doubled (532 nm) or frequency-tripled (355 nm) Nd:YAG laser or excimer lasers (for example 248 nm). The image information to be engraved in is transferred directly from the layout computer system to the laser apparatus. The lasers can be operated either continuously or in pulsed mode.

The relief layer is removed very completely by the laser, meaning that intensive post-cleaning is generally unnecessary. If desired, however, the printing plate obtained can be post-cleaned. A cleaning step of this type removes layer constituents which have been loosened, but possibly not removed completely from the plate surface. In general, simple treatment with water or methanol is entirely sufficient.

The invention is explained in greater detail by the following examples.

EXAMPLES 1–6 AND COMPARATIVE EXAMPLES A AND B

| Starting materials: | |
|---|---|
| Kraton ® D-1161 | SIS block copolymer from Kraton Polymers (binder) |
| Kraton ® D-1102 | SIS block copolymer from Kraton Polymers (binder) |
| JSR RB 810 | Syndiotactic 1,2-polybutadiene from JSR containing 90% of 1,2-units, and having a degree of crystallinity of about 15% and a mean molecular weight of about 120,000 g/mol (binder) |
| Lithene ® PH | Oligomeric polybutadiene oil from Chemetall GmbH having a mean molecular weight of about 2600 g/mol (plasticizer) |
| Lauryl acrylate | (Crosslinking monomer) |
| 1,6-hexanediol diacrylate | (Crosslinking monomer) |
| 1,6-hexanediol divinyl ether | (Crosslinking monomer) |
| Plastomoll ® DNA | Diisononyl adipate |
| Lucirin ® BDK | Benzil dimethyl ketal from BASF AG (photoinitiator) |
| Dicumyl peroxide | (Thermal initiator) |
| Kerobit ® TBK | 2,6-di-tert-butyl-p-cresol from Raschig (stabilizer) |
| Printex ® A | Finely divided carbon black from Degussa-Hüls (laser radiation-absorbent material) |
| Toluene | (Solvent) |

EXAMPLE 1

124 g of JSR RB 810, 16 g of Lithene PH, 16 g of lauryl acrylate, 2.4 g of Lucirin® BDK and 1.6 g of Kerobit® TBK are dissolved in 240 g of toluene at 110° C. The homogeneous solution obtained is cooled to 70° C. and applied with the aid of a knife coater to a plurality of transparent PET films in such a way that a homogeneous dry-layer thickness of 1.20 mm is obtained in each case. The layers produced in this way are firstly dried at 25° C. for 18 hours and subsequently at 50° C. for 3 hours. The dried layers are subsequently each laminated onto a piece of a second PET film of the same size. After a storage time of one day, the layer is crosslinked photochemically as explained below and characterized as described below.

EXAMPLE 2

Layers are produced analogously to the process described in Example 1, with the difference that 116 g of JSR RB 810, 24 g of Lithene PH, 16 g of lauryl acrylate, 2.4 g of Lucirin® BDK and 1.6 g of Kerobit® TBK are dissolved in 240 g of toluene at 110° C.

EXAMPLE 3

Layers are produced analogously to the process described in Example 1, with the difference that 116 g of JSR 810, 16 g of Lithene PH, 16 g of lauryl acrylate, 8 g of hexanediol diacrylate, 2.4 g of Lucirin® BDK and 1.6 g of Kerobit® TBK are dissolved in 240 g of toluene at 110° C.

EXAMPLE 4

Layers are produced analogously to the process described in Example 1, with the difference that 108 g of JSR RB 810, 16 g of Lithene PH, 24 g of hexanediol divinyl ether, 8 g of hexanediol diacrylate, 2.4 g of Lucirin® BDK and 1.6 g of Kerobit® TBK are dissolved in 240 g of toluene at 110° C.

EXAMPLE 5

Layers are produced analogously to the process described in Example 1, with the difference that 92 g of JSR RB 810, 32 g of Kraton® D-1161, 16 g of Lithene PH, 8 g of lauryl acrylate, 8 g of hexanediol diacrylate, 2.4 g of Lucirin® BDK and 1.6 g of Kerobit® TBK are dissolved in 240 g of toluene at 110° C.

EXAMPLE 6

108.8 g of JSR RB 810, 16 g of Plastomoll® DNA, 16 g of Lithene PH and 1.6 g of Kerobit® TBK and 16 g of Printex® A are compounded in a laboratory compounder for 15 minutes at a specified temperature of 100° C.

The resultant compound (158.4 g) is dissolved in 240 g of toluene at 110° C. After the solution has been cooled to 60° C., 1.6 g of dicumyl peroxide are added. After homogenization by stirring, the resultant solution is applied by means of a knife coater to a plurality of transparent PET films in such a way that a homogeneous dry-layer thickness of 1.20 mm is obtained in each case. The layers produced in this way are dried firstly at 25° C. for 18 hours and subsequently at 50° C. for 3 hours. The dried layers are subsequently each laminated onto a piece of a second PET film of the same size. After a storage time of one day, the layer is thermally crosslinked at 160° C. for 15 minutes and characterized as described below.

COMPARATIVE EXAMPLE A 124 g of Kraton® D-1161, 16 g of Lithene® PH, 16 g of lauryl acrylate, 2.4 g of Lucirin® BDK and 1.6 g of Kerobit® TBK are dissolved in 240 g of toluene at 110° C. The resultant homogeneous solution is cooled to 70° C. and applied by means of a knife coater to a plurality of transparent PET films in such a way that a homogeneous dry-layer thickness of 1.20 mm is obtained in each case. The layers produced in this way are dried firstly at 25° C. for 18 hours and subsequently at 50° C. for 3 hours. The dried layers are subsequently each laminated onto a piece of a second PET film of the same size. After a storage time of one day, the layer is crosslinked photochemically by the procedure explained below and characterized as described below.

COMPARATIVE EXAMPLE B

Layers are produced analogously to the process described in Comparative Example A, with the difference that 124 g of Kraton® D-1161, 16 g of Lithene® PH, 16 g of lauryl acrylate, 2.4 g of Lucirin® BDK and 1.6 g of Kerobit® TK are dissolved in 240 g of toluene at 110° C.

Crosslinking

Photochemical Crosslinking

The photochemical crosslinking of the example layers described was carried out using a nyloflex® F III exposure unit from BASF Drucksysteme GmbH by firstly removing the transparent PET protective film and subsequently irradiating the layers with UVA light over the full area without vacuum for the respective duration of the exposure series.

Thermal Crosslinking

For thermal crosslinking, firstly the transparent PET protective film was removed, and the layer was subsequently heated at the selected temperature without inertization for the duration of the crosslinking.

Duration of the Crosslinking

The layers obtained from the examples and comparative examples were each photochemically or thermally crosslinked in steps of one minute of exposure duration. The exposure time at which the breaking stress was at its maximum was determined as the optimum crosslinking duration $t_{opt}$ by mechanical measurements on a type 1435 tensile tester (Zwick GmbH & Co.), and an uncrosslinked layer was crosslinked for this optimum crosslinking duration for all examples and comparative examples. The following properties of the layers crosslinked in this way and the corresponding uncrosslinked layers as reference were determined:

- tear strength and elongation at break at the optimum crosslinking duration (using type 1435 tensile tester, Zwick GmbH & Co.)
- hardness in accordance with DIN 53505 in °Shore A (using type U 72/80E hardness measuring instrument, Heinrich Bareiss Prüfgerätebau GmbH)

The crosslinking conditions (optimum crosslinking duration $t_{opt}$ and crosslinking type) and the measurement values obtained are shown in Table 1.

TABLE 1

| Ex. No. | Crosslinking method | Crosslinking conditions $t_{opt}$ [min] | Type | Tear strength [MPa] U* | C** | Elongation at break [%] U | C | Mech. hardness [° Shore A] U | C |
|---|---|---|---|---|---|---|---|---|---|
| A | photochemical | 5 | UVA | 1.4 | 3.6 | 2000 | 1000 | <30 | 32 |
| B | photochemical | 5 | UVA | 2.8 | 8.5 | 1040 | 1080 | 47 | 59 |
| 1 | photochemical | 1 | UVA | 5.2 | 4.0 | 1230 | 250 | 50 | 62 |
| 2 | photochemical | 1 | UVA | 4.5 | 3.3 | 1150 | 250 | 48 | 60 |
| 3 | photochemical | 1 | UVA | 4.3 | 3.3 | 1130 | 100 | 48 | 68 |
| 4 | photochemical | 1 | UVA | 6.1 | 10.8 | 1130 | 760 | 46 | 66 |
| 5 | photochemical | 1 | UVA | 2.9 | 7.1 | 1000 | 250 | 44 | 67 |
| 6 | thermal | 5 | 160° C. | 4.7 | 6.1 | 700 | 590 | 50 | 64 |

*U = uncrosslinked
**C = crosslinked

Laser Engraving Experiments

The laser engraving experiments were carried out using a laser unit with rotating outer drum (ALE Meridian Finesse) which was fitted with a $CO_2$ laser with an output power of 250 W. The laser beam was focused on a diameter of 20 μm. The flexographic printing elements to be engraved were stuck to the drum using adhesive tape, and the drum was accelerated to 250 rpm.

In order to assess the laser engraving result, in each case the letter A (font Helvetica, font size 24 pt) was engraved as positive into the crosslinked material. The resolution was 1270 dpi. In order to assess the quality, a section of the engraved letter A was imaged photo-graphically by a light microscope at a magnification of 32 times. Furthermore, two lines having a width of 20 μm at a separation of 20 μm were engraved into the respective material. Scanning electron photomicrographs were prepared of the negative line pairs.

For the two elements (letter A and negative line pair), three features each were assessed on a score scale from 1–5.

ES Edge Sharpness (Sharpness of the Surface Edges)
- 1: no irregularities or break-outs
- 2: only isolated wave formation or break-outs
- 3: repeated break-outs and deformations of low amplitude
- 4: numerous irregularities, break-outs and deformations
- 5: no sharp-edged sections present, contours indistinguishable DD Depth Definition (Shape and Uniformity of the Relief Depths)
- 1: depths sharply delimited, uniform flanks
- 2: depths slightly deformed, flanks slightly furrowed
- 3: repeated deformation of the depths, flanks furrowed or indistinct
- 4: depths frequently deformed, flanks irregular and highly furrowed
- 5: no depth definition, depths blocked or uniformly molten SQ Surface Quality (Quality of the Relief Surface)
- 1: no deposits evident on the surface
- 2: few deposits on the surface, only individual particles
- 3: repeated deposits and residues
- 4: numerous deposits and residues, lumps and accumulations
- 5: surface dirty all over, melted together, covered with deposits FIGS. 1.1–1.8 and 2.1–2.8 show the photographs and scanning electron photomicrographs on which the assessment is based, in which:

FIG. 1.1 shows a photograph of section "A"—Example 1

FIG. 1.2 shows a photograph of section "A"—Example 2

FIG. 1.3 shows a photograph of section "A"—Example 3

FIG. 1.4 shows a photograph of section "A"—Example 4

FIG. 1.5 shows a photograph of section "A"—Example 5

FIG. 1.6 shows a photograph of section "A"—Example 6

FIG. 1.7 shows a photograph of section "A"—Comparative Example A

FIG. 1.8 shows a photograph of section "A"—Comparative Example B

FIG. 2.1 shows an SEM photomicrograph of the negative line pair—Example 1

FIG. 2.2 shows an SEM photomicrograph of the negative line pair—Example 2

FIG. 2.3 shows an SEM photomicrograph of the negative line pair—Example 3

FIG. 2.4 shows an SEM photomicrograph of the negative line pair—Example 4

FIG. 2.5 shows an SEM photomicrograph of the negative line pair—Example 5

FIG. 2.6 shows an SEM photomicrograph of the negative line pair—Example 6

FIG. 2.7 shows an SEM photomicrograph of the negative line pair—Comparative Example A FIG. 2.8 shows an SEM photomicrograph of the negative line pair—Comparative Example B Table 2 shows the assessments of the said features and the arithmetic means of all features.

TABLE 2

| Example | Letter A as in FIG. 1.χ | | | Negative line pair as in FIG. 2.χ | | | Mean over |
|---|---|---|---|---|---|---|---|
| No. | ES | DD | SQ | ES | DD | SQ | all features |
| 1 | 2 | 2 | 1 | 1 | 1 | 2 | 1.5 |
| 2 | 1 | 1 | 2 | 1 | 2 | 1 | 1.3 |
| 3 | 1 | 2 | 1 | 2 | 3 | 3 | 2.0 |
| 4 | 2 | 1 | 2 | 2 | 3 | 2 | 2.0 |
| 5 | 1 | 1 | 2 | 2 | 3 | 2 | 1.8 |
| 6 | 1 | 3 | 2 | 3 | 4 | 3 | 2.7 |
| A | 5 | 5 | 5 | 5 | 5 | 4 | 4.8 |
| B | 4 | 3 | 4 | 5 | 4 | 4 | 4.0 |

The superior quality of the relief elements produced by means of laser engraving in flexographic printing elements based on syndiotactic 1,2-polybutadiene (Examples) compared with conventional flexographic printing elements (comparative examples) is evident from the assessed features. In all examples according to the invention, extremely fine relief elements such as the negative line pairs shown can be imaged in high quality. Furthermore, the quality of larger engraved relief elements, as shown by way of example by the section of the letter A, in flexographic printing elements based on syndiotactic 1,2-polybutadiene is significantly better, since strong melting phenomena or material deposits on the printing surface are avoided.

We claim:

1. A laser-engravable flexographic printing element comprising an elastomeric, relief-forming, laser-engravable, thermally and/or photochemically crosslinkable layer comprising, (a) from 50 to 99.9% by weight of one or more binders as component A, consisting of (a1) from 5 to 100% by weight of syndiotactic 1, 2-polybutadiene having a content of 1, 2-linked butadiene units of from 80 to 100%, a degree of crystallinity of from 5 to 30% and a mean molecular weight of from 20,000 to 300,000 g/mol as component A1, and (a2) from 0 to 95% by weight of further binders as component A2, where the sum of components A1 and A2 gives 100% by weight, (b) from 0.1 to 30% by weight of crosslinking, one or more oligomeric plasticizers which contain reactive groups in the main chain and/or reactive pendant and/or terminal groups, wherein said plasticizers are selected from the group consisting of polybutadiene oils having a molecular weight of from about 1,000 to about 3,000 g/mol, a content of I, 2-linked units of from 1 to 50%, a flash point of from 170° C. to 300° C. and a viscosity of from 700 to 100,000 mPas at 25° C., as component B, (c) from 0 to 25% by weight of one or more ethylenically unsaturated monomers as component C, (d) from 0 to 10% by weight of one or more photomitiators and/or thermally decomposable initiators as component D, (e) from 0 to 20% by weight of one or more absorbers for laser radiation as component E, and (f) from 0 to 30% by weight of one or more further conventional additives as component F, where the sum of components A to F adds up to 100% by weight.

2. A process for the production of a relief printing element, comprising the steps of (i) thermal or photochemical crosslinking of the elastomeric, relief-forming layer of a flexographic printing element said elastomeric layer comprising (a) from 50to 99.9% by weight of one or more binders as component A, consisting of (a1) from 5 to 100% by weight of syndiotactic 1,2-polybutadiene having a content of 1,2-linked butadiene units of from 80 to 100%, a degree of crystallinity of from 5 to 30% and a mean molecular weight of from 20,000 to 300,000 g/mol as component A1, and (a2) from 0 to 95% by weight of further binders as component A2, where the sutu of components A1 and A2 gives 100% by weight, (b) from 0.1 to 30% by weight of crosslinking, one or more oligomeric plasticizers which contain reactive groups in the main chain and/or reactive pendant and/or terminal groups as component B, (c) from 0 to 25% by weight of one or more ethylenically unsaturated monomers as component C, (d) from 0 to 10% by weight of one or more photoinitiators and/or thermally decomposable initiators as component D, (e) from 0 to 20% by weight of one or more absorbers for laser radiation as component E, and (f) from 0 to 30% by weight of one or more further conventional additives as component F, where the sum of components A to F adds up to 100% by weight, (ii) laser engraving of a printing relief into the crosslinked, elastomeric, relief-forming layer.

3. A process for the production of a relief printing element, comprising the steps of (i) thermal or photochemical crosslinking of the elastomeric, relief-forming layer of a flexographic printing element comprising an elastomeric, relief-forming, laser-engravable, thermally and/or photochemically crosslinkable layer comprising, as binder, at least 5% by weight of syndiotactic 1,2-polybutadiene having a content of 1,2-linked butadiene units of from 80 to 100%, a degree of crystallinity of from 5 to 30% and a mean molecular weight of from 20,000 to 300,000 g/mol on a flexible, dimensionally stable support, and (ii) laser engraving of a printing relief into the crosslinked, elastomeric, relief forming layer.

* * * * *

UNITED STATES PATENT AND TRADEMARK OFFICE

CERTIFICATE OF CORRECTION

PATENT NO. : 7,101,653 B2
APPLICATION NO. : 10/475216
DATED : September 5, 2006
INVENTOR(S) : Kaczun et al.

It is certified that error appears in the above-identified patent and that said Letters Patent is hereby corrected as shown below:

Col. 12, line 59: “a content of l, 2-linked” should read --a content of 1, 2-linked--

Col. 13, line 12: “from 50to 99.9%” should read --from 50 to 99.9%--

Signed and Sealed this

Tenth Day of April, 2007

JON W. DUDAS
*Director of the United States Patent and Trademark Office*